United States Patent
Wang et al.

(10) Patent No.: US 10,141,444 B2
(45) Date of Patent: Nov. 27, 2018

(54) OXIDE THIN-FILM TRANSISTOR WITH ILLUMINATED OHMIC CONTACT LAYERS, ARRAY SUBSTRATE AND METHODS FOR MANUFACTURING THE SAME, AND DISPLAY DEVICE

(71) Applicant: BOE TECHNOLOGY GROUP CO., LTD., Beijing (CN)

(72) Inventors: Ke Wang, Beijing (CN); Ce Ning, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/156,858

(22) Filed: May 17, 2016

(65) Prior Publication Data

US 2016/0359053 A1 Dec. 8, 2016

(30) Foreign Application Priority Data

Jun. 8, 2015 (CN) .......................... 2015 1 0308733

(51) Int. Cl.
*H01L 21/70* (2006.01)
*H01L 29/786* (2006.01)
(Continued)

(52) U.S. Cl.
CPC ...... *H01L 29/78618* (2013.01); *H01L 27/127* (2013.01); *H01L 27/1225* (2013.01);
(Continued)

(58) Field of Classification Search
CPC .................. H01L 29/66969; H01L 21/428
See application file for complete search history.

(56) References Cited

U.S. PATENT DOCUMENTS 7,468,304 B2 * 12/2008 Kaji ................. H01L 21/02554
438/149
2002/0084465 A1 * 7/2002 Green ............... H01L 29/42384
257/91
(Continued)

FOREIGN PATENT DOCUMENTS

CN 102064109 A 5/2011
CN 104282768 A 1/2015
(Continued)

OTHER PUBLICATIONS

First Office Action regarding Chinese Application No. 201510308733.6, dated Jul. 26, 2017. Translation provided by Dragon Intellectual Property Law Firm.
(Continued)

*Primary Examiner* — Ismail Muse
(74) *Attorney, Agent, or Firm* — Harness, Dickey & Pierce, P.L.C.

(57) ABSTRACT

An oxide thin-film transistor, an array substrate and methods for manufacturing the same, and a display device are provided. The method for manufacturing the oxide thin-film transistor includes: forming a pattern of an oxide semi-conductor layer above a base substrate; and illuminating, by a light source, two opposite boundary regions of the pattern of the oxide semi-conductor layer, where the illuminated two opposite boundary regions of the pattern of the oxide semi-conductor layer form ohmic contact layers and a region of the pattern of the oxide semi-conductor layer that is not illuminated forms a semi-conductor active layer; forming a source electrode and a drain electrode which are connected to the semi-conductor active layer via the ohmic contact layers respectively.

19 Claims, 7 Drawing Sheets

(51) Int. Cl.
*H01L 29/66* (2006.01)
*H01L 29/24* (2006.01)
*H01L 27/12* (2006.01)
*H01L 27/32* (2006.01)

(52) U.S. Cl.
CPC .......... *H01L 27/3272* (2013.01); *H01L 29/24* (2013.01); *H01L 29/66969* (2013.01); *H01L 29/7869* (2013.01); *H01L 29/78633* (2013.01); *H01L 29/78696* (2013.01)

(56) References Cited

U.S. PATENT DOCUMENTS

| | | | | |
|---|---|---|---|---|
| 2005/0219435 | A1* | 10/2005 | Oh | G02F 1/13454 349/43 |
| 2007/0269750 | A1* | 11/2007 | Irving | G03F 7/2014 430/322 |
| 2009/0130600 | A1* | 5/2009 | Irving | G03F 7/2022 430/312 |
| 2009/0286351 | A1* | 11/2009 | Hirao | H01L 29/7869 438/104 |
| 2010/0044701 | A1* | 2/2010 | Sano | H01L 27/1225 257/43 |
| 2012/0018718 | A1* | 1/2012 | Zan | H01L 29/42384 257/43 |
| 2012/0097943 | A1* | 4/2012 | Lin | H01L 29/7869 257/43 |
| 2013/0309808 | A1* | 11/2013 | Zhang | H01L 29/78648 438/104 |
| 2015/0017761 | A1* | 1/2015 | Ando | H01L 21/428 438/104 |
| 2015/0029429 | A1* | 1/2015 | Choi | G02F 1/1368 349/43 |
| 2015/0129870 | A1* | 5/2015 | Hsin | H01L 29/78618 257/43 |
| 2015/0144952 | A1* | 5/2015 | Kim | H01L 27/3262 257/72 |
| 2016/0104723 | A1* | 4/2016 | Tanaka | H01L 27/124 257/43 |
| 2016/0322390 | A1* | 11/2016 | Okumura | H01L 27/1225 |
| 2017/0069760 | A1* | 3/2017 | Yamazaki | H01L 21/02554 |
| 2017/0250289 | A1* | 8/2017 | Sugawara | H01L 29/78606 |

FOREIGN PATENT DOCUMENTS

| | | |
|---|---|---|
| CN | 104637950 A | 5/2015 |
| JP | 2007288122 A | 11/2007 |

OTHER PUBLICATIONS

Second Chinese Office Action regarding Application No. 201510308733.6 dated Apr. 3, 2018. Translation provided by Dragon Intellectual Property Law Firm.

* cited by examiner

US 10,141,444 B2

OXIDE THIN-FILM TRANSISTOR WITH ILLUMINATED OHMIC CONTACT LAYERS, ARRAY SUBSTRATE AND METHODS FOR MANUFACTURING THE SAME, AND DISPLAY DEVICE

CROSS-REFERENCE TO RELATED APPLICATION

The present application claims priority to Chinese Patent Application No. 201510308733.6 filed on Jun. 8, 2015, the disclosure of which is incorporated in its entirety by reference herein.

FIELD

The present disclosure relates to the field of display technology, and in particular, to an oxide thin-film transistor, an array substrate and methods for manufacturing the same, and a display device.

BACKGROUND

An oxide thin-film transistor mainly includes a gate electrode, an oxide semi-conductor layer, a source electrode and a drain electrode. In order to enhance ohmic contact between the source electrode and the oxide semi-conductor layer and ohmic contact between the drain electrode and the oxide semi-conductor layer, a plasma treatment process is employed so as to convert two boundary regions of the oxide semi-conductor layer in contact with the source electrode and the drain electrode into conductors. The plasma treatment process is mainly used to enhance, using a plasma, the plasma environment of a plasma enhanced chemical vapor deposition (PECVD) equipment or a dry etch equipment, for example, a plasma of. e.g., helium (He) gas, argon (Ar) gas or sulfur hexafluoride (SF6) gas is used to convert two boundary regions of the oxide semiconductor layer in contact with the source electrode and the drain electrode into conductors.

However, other layers of the thin-film transistor would be damaged by the plasma treatment process, such that performance of the thin-film transistor is affected. In addition, a reversible change is prone to occur to a conductor obtained through a plasma treatment process, such conductor may be restored to a semi-conductor, and the thin-film transistor may be out of function.

SUMMARY

In view of this, it is provided an oxide thin-film transistor, an array substrate and methods for manufacturing the same, and a display device in the present disclosure, so as to resolve a problem that related film layers of a thin-film transistor are prone to be damaged during a plasma treatment process.

It is provided a method for manufacturing an oxide thin-film transistor in the present disclosure, and the method includes: forming a pattern of an oxide semi-conductor layer above a base substrate; and illuminating, by a light source, two opposite boundary regions of the pattern of the oxide semi-conductor layer. The illuminated two opposite boundary regions of the pattern of the oxide semi-conductor layer form ohmic contact layers, and a region of the pattern of the oxide semi-conductor layer that is not illuminated forms a semi-conductor active layer.

Optionally, the method for manufacturing the oxide thin-film transistor may further include: forming a source electrode and a drain electrode which are respectively connected to the semi-conductor active layer through the ohmic contact layers.

Optionally, the oxide thin-film transistor is of a top-gate structure. Before the step of the forming the pattern of the oxide semi-conductor layer above the base substrate, the method further includes: forming a pattern of a light shielding layer on the base substrate. An orthographic projection of the pattern of the light shielding layer onto the base substrate is completely located within and is smaller than an orthographic projection of the pattern of the oxide semi-conductor layer onto the base substrate. The step of the illuminating, by the light source, the two opposite boundary regions of the pattern of the oxide semi-conductor layer includes: providing the light source at a side of the base substrate away from the light shielding layer; and illuminating, by the light source, the two opposite boundary regions of the pattern of the oxide semi-conductor layer that are not shielded by the light shielding layer. The base substrate is made of a light-transmissive material.

Optionally, after the step of forming the pattern of the light shielding layer on the base substrate and before the step of forming the pattern of the oxide semi-conductor layer above the base substrate, the method further includes: forming an inorganic insulating medium layer covering the light shielding layer.

Optionally, the inorganic insulating medium layer is made of silicon dioxide.

Optionally, the oxide thin-film transistor is of a top-gate structure, and the method further includes: forming a gate insulator on the semi-conductor active layer and forming a gate electrode on the gate insulator; and forming an insulating interlayer and forming via holes penetrating the insulating interlayer. Locations of the via holes correspond to locations of the ohmic contact layers. The source electrode and the drain electrode cover respectively the via holes, and are connected with the ohmic contact layers through the via holes.

Optionally, the step of the illuminating, by the light source, the two opposite boundary regions of the pattern of the oxide semi-conductor layer includes: providing a light shielding plate at a side of the pattern of the oxide semi-conductor layer away from the base substrate, where an orthographic projection of the light shielding plate onto the base substrate is completely located within and is smaller than an orthographic projection of the pattern of the oxide semi-conductor layer onto the base substrate; and providing the light source at a side of the light shielding plate away from the pattern of the oxide semi-conductor layer, and illuminating, by the light source, the two opposite boundary regions of the pattern of the oxide semi-conductor layer that are not shielded by the light shielding plate.

Optionally, the light source is an ultraviolet light source.

Optionally, a wavelength of the ultraviolet light source ranges from 173 nm to 365 nm, an illumination duration of the ultraviolet light source ranges from 1 to 30 seconds.

Optionally, the oxide semi-conductor layer is made of indium gallium zinc oxide or indium tin zinc oxide.

It is further provided a method for manufacturing an oxide thin-film transistor array substrate in the present disclosure, and this method includes steps of the method for manufacturing the oxide thin-film transistor described above.

It is further provided an oxide thin-film transistor in the present disclosure, which includes: ohmic contact layers, a semi-conductor active layer, a source electrode and a drain electrode. The source electrode and the drain electrode are connected to the semi-conductor active layer through the ohmic contact layers. The ohmic contact layers and the semi-conductor active layer are formed by illuminating a pattern of an oxide semi-conductor layer by a light source. Illuminated two opposite boundary regions of the pattern of the oxide semi-conductor layer form the ohmic contact layers, and a region of the pattern of the oxide semi-conductor layer that is not illuminated forms the semi-conductor active layer.

It is further provided an oxide thin-film transistor array substrate in the present disclosure, which includes the oxide thin-film transistor described above.

It is further provided a display device in the present disclosure, which includes the oxide thin-film transistor array substrate described above.

In the present disclosure, two opposite boundary regions of a pattern of an oxide semi-conductor layer in contact with a source electrode and a drain electrode are illuminated by a light source so as to form conductors, i.e., ohmic contact layers, such that ohmic contact between the source electrode and the oxide semi-conductor layer and ohmic contact between the drain electrode and the oxide semi-conductor layer are enhanced. In addition, a problem that various film layers of a thin-film transistor is prone to be damaged by a plasma treatment process in related technology is resolved, and the conductor formed through light illumination is of a stable property.

Figure 1:
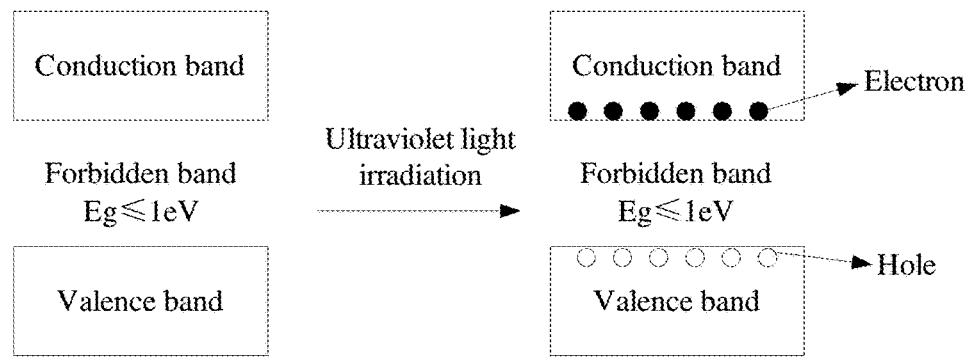
FIG. 1 is a schematic diagram of converting an oxide semi-conductor into a conductor by illuminating the oxide semi-conductor with a light source according to some embodiments of the present disclosure.

Reference Numerals:

101 Base substrate; 102 Gate electrode; 103 Gate insulator; 104: Oxide semi-conductor layer; 1041 Ohmic contact layer; 1042 Semi-conductor active layer 1051 Source electrode; 1052 Drain electrode; 106 Light shielding layer; 107 Inorganic insulating medium layer; 108 Insulating interlayer; 1081 Via hole; 202 Light source; 201 Light shielding plate.

DETAILED DESCRIPTION OF THE EMBODIMENTS

Specific implementations of the present disclosure are further described below in detail in conjunction with accompanying drawings and embodiments. Following embodiments are only intended to illustrate the present disclosure, but not to limit the scope of the present disclosure.

Figure 2:
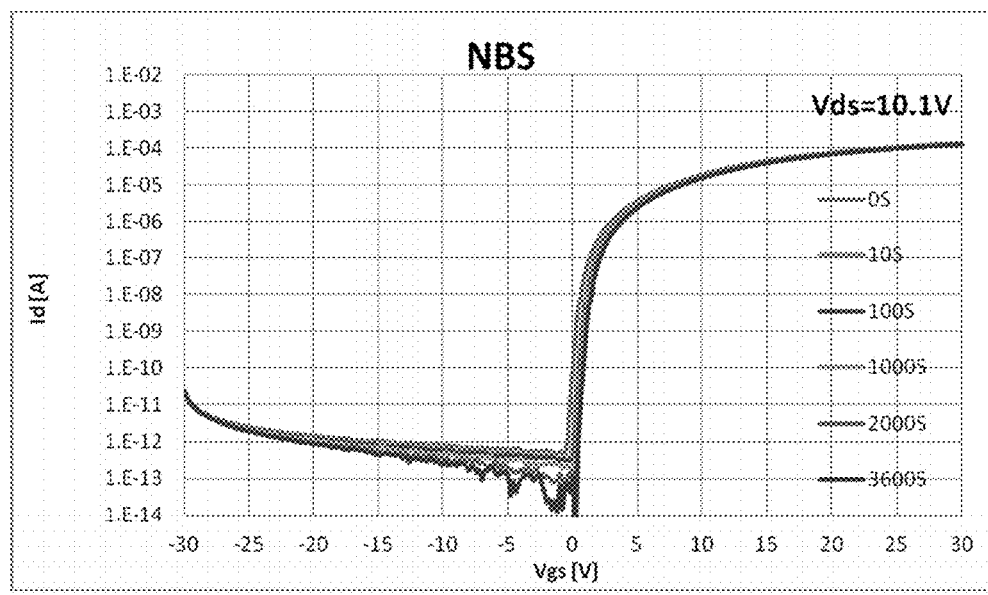
FIG. 2 is a schematic diagram of a result of a negative bias stress (NBS) test for an IGZO thin-film transistor.

A band gap of an oxide semi-conductor, such as indium gallium zinc oxide (IGZO), indium tin zinc oxide (ITZO) or the like, is relatively narrow. Under a situation of absolute zero, as shown in FIG. 2, a valence band is a filled band, and a conduction band is an empty band and cannot achieve conduction. Since a width of a forbidden band of the oxide semi-conductor is relatively small, when the oxide semi-conductor is illuminated by a light source (for example, an ultraviolet light), an electron at the top of the valence band absorbs the energy of the light source and is excited into the conduction band, a hole layer is formed at the top of the valence band and an electron layer is formed at the bottom of the conduction band; hence, the oxide semi-conductor is converted into a conductor.

Figure 3:
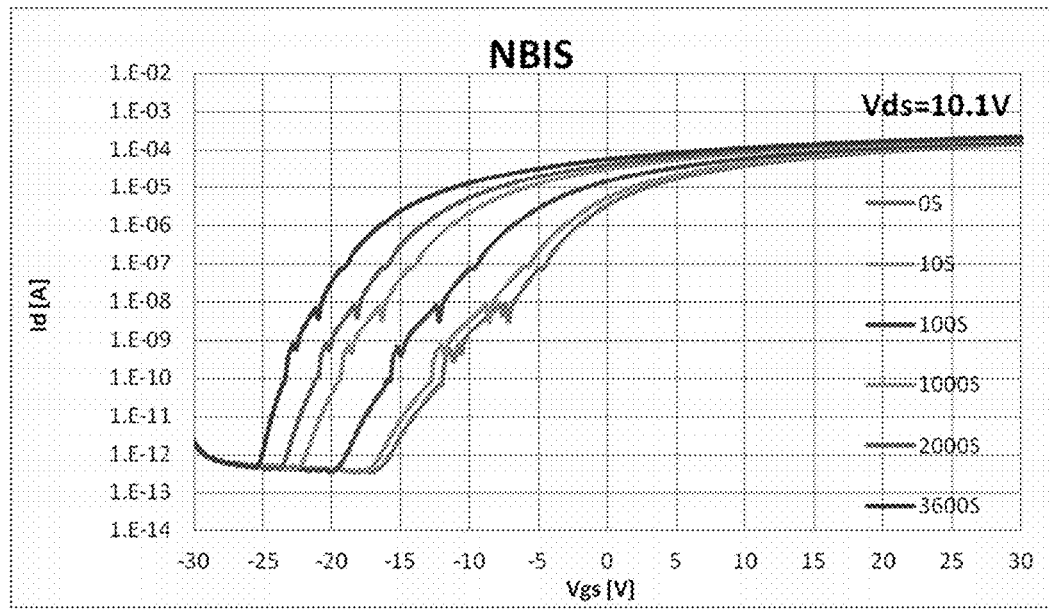
FIG. 3 is a schematic diagram of a result of a negative bias illumination stress (NBIS) test for an IGZO thin-film transistor.
Figure 4A:
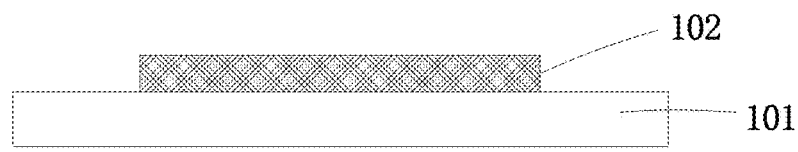
FIG. 4A to FIG. 4E are schematic views of a method for manufacturing an oxide thin-film transistor of a bottom-gate structure according to some embodiments of the present disclosure.
Figure 4B:
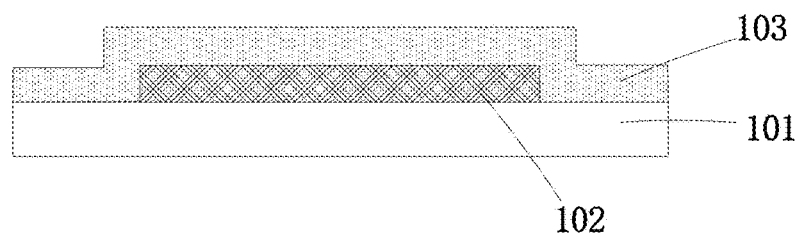
Figure 4C:
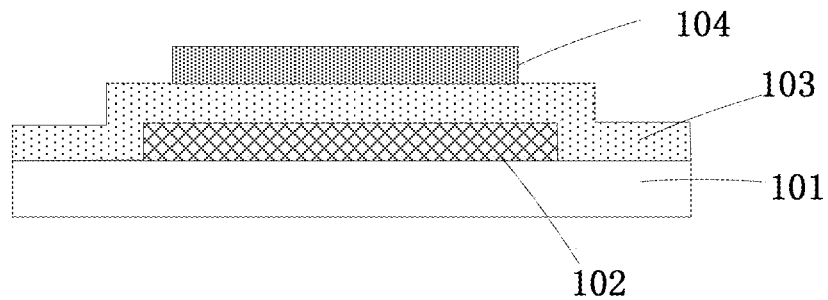
Figure 4D:
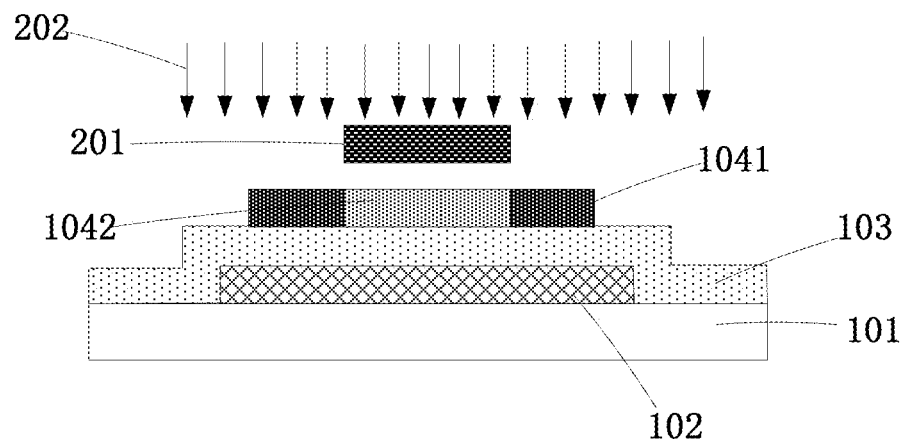
Figure 4E:
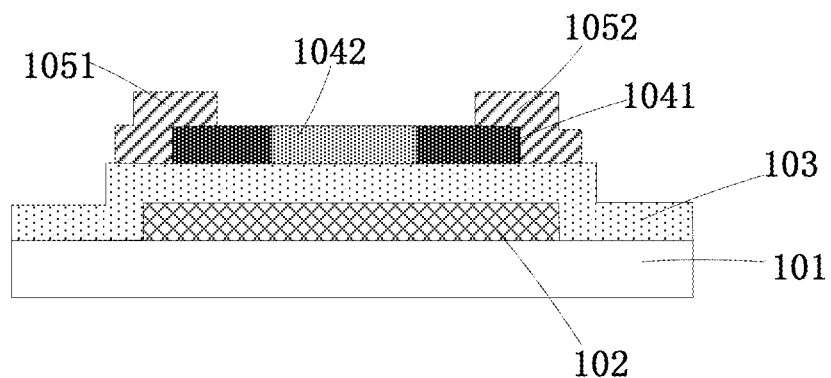

References are made to FIG. 2 and FIG. 3, FIG. 2 illustrates a schematic diagram of a result of an NBS test for an IGZO thin-film transistor and FIG. 3 illustrates a schematic diagram of a result of an NBIS test for an IGZO thin-film transistor. In FIG. 2 and FIG. 3, Vgs represents a voltage between a gate electrode and a source electrode, Vds is represents a voltage between a drain electrode and the source electrode, and Id represents a drain current.

As can be seen from FIG. 2, in a case that a Vgs of −30 volts and a Vds of 10.1 volts are applied to the IGZO thin-film transistor, 3600 seconds later, Vth (a threshold voltage) which is a Vg (a voltage across the gate electrode) corresponding to an Id of $10^{-8}$ amperes, changes little, and the IGZO thin-film transistor still maintains characteristics of the semi-conductor. However, as shown in FIG. 3, in a case that a Vgs of −30 volts and a Vds of 10.1 volts are applied to the IGZO thin-film transistor and the IGZO thin-film transistor is illuminated by an ultraviolet light having a brightness of 10000 lux, a negative bias of the Vth is about 15 volts, i.e., the IGZO thin-film transistor is tended to become a conductor.

It can be verified from experimental data described above, the oxide semi-conductor can be converted into a conductor upon illumination of the light source.

Based on the above theory, it is provided a method for manufacturing an oxide thin-film transistor according to some embodiments of the present disclosure, and the method includes following steps S11 to S13.

In step S11, a pattern of an oxide semi-conductor layer is formed above a base substrate.

In step S12, two opposite boundary regions of the pattern of the oxide semi-conductor layer are illuminated by a light source, the illuminated two opposite boundary regions of the pattern of the oxide semi-conductor layer form ohmic contact layers, and a region of the pattern of the oxide semi-conductor layer that is not illuminated forms a semi-conductor active layer.

In step S13, a source electrode and a drain electrode are formed, and the source electrode and the drain electrode are respectively connected to the semi-conductor active layer through the ohmic contact layers.

With the above method, two opposite boundary regions of a pattern of an oxide semi-conductor layer in contact with a source electrode and a drain electrode are illuminated by a light source so as to form conductors, i.e., ohmic contact layers, such that ohmic contact between the source electrode and the oxide semi-conductor layer and ohmic contact between the drain electrode and the oxide semi-conductor layer are enhanced. In addition, a problem that various film layers of a thin-film transistor is prone to be damaged by a plasma treatment process in related technology is resolved, and the conductor formed through light illumination is of a stable property.

In the above embodiments, the oxide thin-film transistor may be of a top-gate structure, i.e., a gate electrode is located between the semi-conductor active layer and the source and drain electrodes; or may be of a bottom-gate structure, i.e., the semi-conductor active layer is located between a gate electrode and the source and drain electrodes.

In a case that the oxide thin-film transistor is of a bottom-gate structure, ohmic contact layers may be formed through following step S121 and step S122.

In step S121, a light shielding plate is provided at a side of the pattern of the oxide semi-conductor layer away from the base substrate, an orthographic projection of the light shielding plate onto the base substrate is completely located in and is smaller than an orthographic projection of the pattern of the oxide semi-conductor layer onto the base substrate, i.e., a size of the light shielding plate is smaller than a size of the pattern of the oxide semi-conductor layer.

In step S122, the light shielding plate is used as a shelter, and two opposite boundary regions of the pattern of the oxide semi-conductor layer that are not shielded by the light shielding plate are illuminated by a light source provided at a side of the light shielding plate away from the pattern of the oxide semi-conductor layer. The illuminated two opposite boundary regions of the pattern of the oxide semi-conductor layer form ohmic contact layers, and a region of the pattern of the oxide semi-conductor layer that is not illuminated (i.e., a region shielded by the light shielding plate) forms a semi-conductor active layer.

References are made to FIG. 4A to FIG. 4E, which illustrate schematic views of a method for manufacturing an oxide thin-film transistor of a bottom-gate structure according to some embodiments of the present disclosure, and the method includes following steps S21 to S25.

In step S21, a gate electrode 102 is formed on a base substrate 101.

The gate electrode 102 may be made of a metallic material such as Mo, Al, Cu or the like, and a thickness of the gate electrode 102 ranges from 200 nm to 300 nm.

In step S22, a gate insulator 103 is formed. The gate insulator 103 may be a single-layer structure such as a single layer of $SiO_2$, a double-layer structure such as one layer of $SiO_2$ and one layer of $SiN_x$, or a three-layer structure such as one layer of $SiO_2$, one layer of SiON and one layer of $SiN_x$. Optionally, a layer of the gate insulator 103 that is in contact with a pattern of an oxide semi-conductor layer formed subsequently is a layer of $SiO_2$, such that hydrogen content of the oxide semi-conductor layer is minimized. A thickness of the gate insulator ranges from 200 nm to 300 nm.

In step S23, a pattern of an oxide semi-conductor layer 104 is formed. A thickness of the oxide semi-conductor layer 104 ranges from 40 mm to 70 nm, the oxide semi-conductor layer 104 may be a single-layer structure; or may be a structure having more than one layer, where in the more than one layer, oxygen content of each layer differs from that of another layer.

In step S24, a light shielding plate 201 is provided at a side of the oxide semi-conductor layer 104 away from the base substrate 101, and the light shielding plate 201 is used as a shelter and two opposite boundary regions of the pattern of the oxide semi-conductor layer 104 that are not shielded by the light shielding plate 201 are illuminated by a light source 202 provided at a side of the light shielding plate 201 away from the oxide semi-conductor layer 104. The illuminated two opposite boundary regions of the pattern of the oxide semi-conductor layer 104 form ohmic contact layers 1041, and a region of the pattern of the oxide semi-conductor layer 104 that is not illuminated, i.e., a region of the pattern of the oxide semi-conductor layer 104 that is shielded by the light shielding plate 201 forms a semi-conductor active layer 1042.

In step S25, a source electrode 1051 and a drain electrode 1052 are formed, and the source electrode 1051 and the drain electrode 1052 are respectively connected to the semi-conductor active layer 1042 through the ohmic contact layers 1041.

Specifically, the source electrode 1051 and the drain electrode 1052 may be made of a metallic material such as Mo, Al, Cu or the like, and a thickness of each of the source electrode 1051 and the drain electrode 1052 ranges from 200 nm to 300 nm.

In above embodiments of the present disclosure, a light shielding plate is employed, which is simple, feasible and cost-effective.

Figure 5:
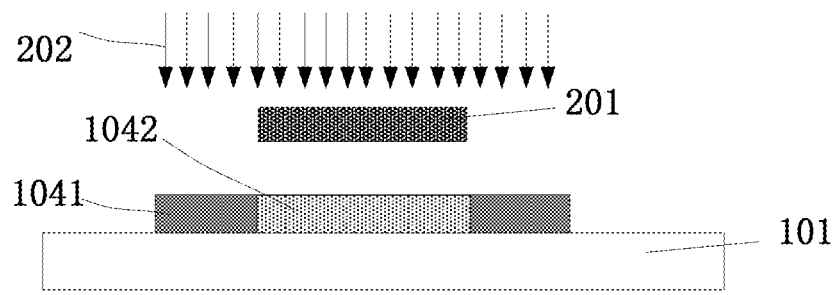
FIG. 5 is a schematic view of a method for manufacturing an oxide thin-film transistor of a top-gate structure according to some embodiments of the present disclosure.
Figure 6A:
FIG. 6A to FIG. 6G are schematic views of a method for manufacturing an oxide thin-film transistor of a top-gate structure according to some embodiments of the present disclosure.
Figure 6B:
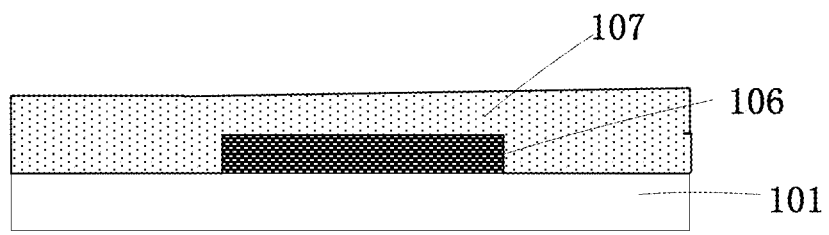
Figure 6C:
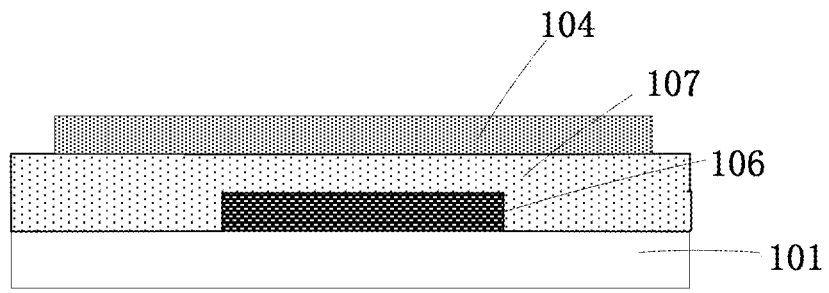
Figure 6D:
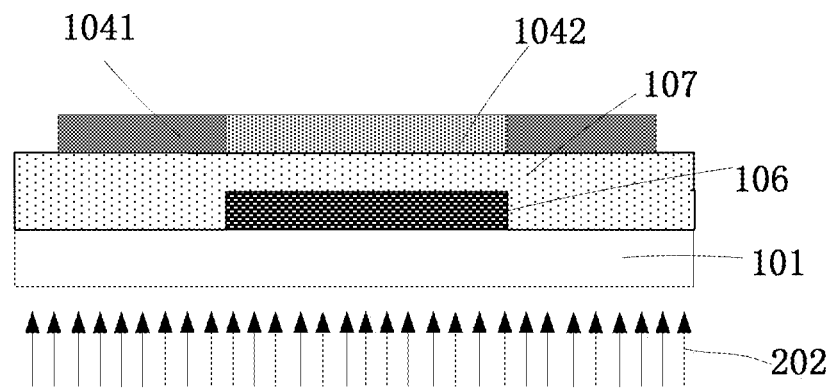
Figure 6E:
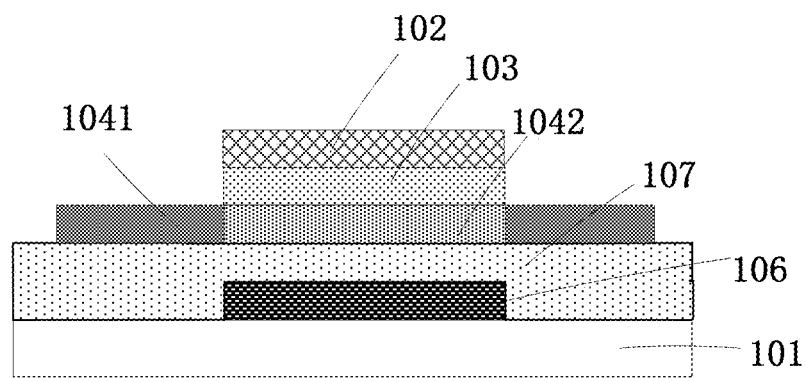
Figure 6F:
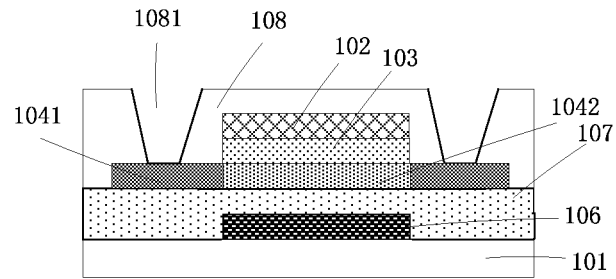
Figure 6G:
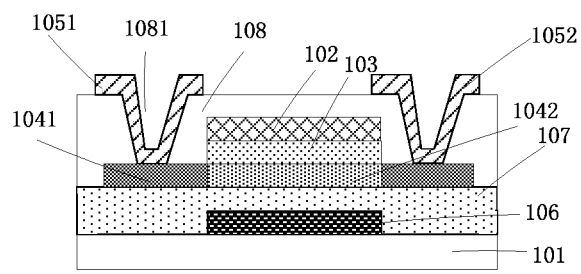
Figure 6H:
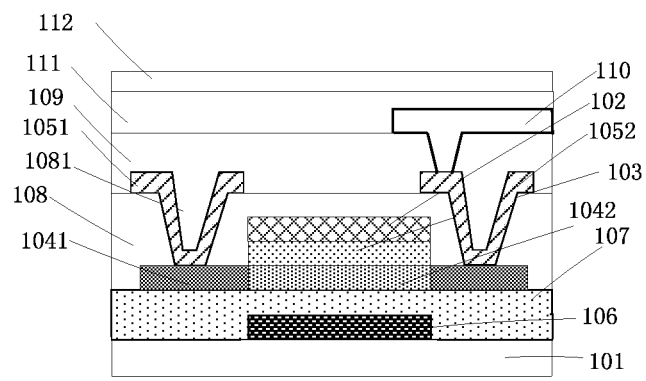
FIG. 6H is a schematic view of a method for manufacturing an oxide thin-film transistor array substrate of a top-gate structure according to some embodiments of the present disclosure, where 109 represents a passivation layer, 110 represents a pixel electrode, 111 represents a second passivation layer and 112 represents a common electrode.

In a case that the oxide thin-film transistor is of a top-gate structure, as shown in FIG. 5, ohmic contact layers may also be formed using the above method in which the light shielding plate is used, while the specific implementation is not explained in detail here.

In addition, in a case that the oxide thin-film transistor is a thin-film transistor of a top-gate structure, ohmic contact layers may be alternatively formed with a following method.

Specifically, before the step of the forming the pattern of the oxide semi-conductor layer above the base substrate, the method further includes: forming a pattern of a light shielding layer on the base substrate, where an orthographic projection of the pattern of the light shielding layer onto the base substrate is completely located within and is smaller than an orthographic projection of the pattern of the oxide semi-conductor layer onto the base substrate, i.e., a size of the pattern of the light shielding layer is smaller than a size of the pattern of the oxide semi-conductor layer.

The step of the illuminating, by the light source, two opposite boundary regions of the pattern of the oxide semi-conductor layer includes: providing the light source at a side of the base substrate away from the light shielding layer, and illuminating, by the light source, two opposite boundary regions of the pattern of the oxide semi-conductor layer that are not shielded by the light shielding layer; where the illuminated two opposite boundary regions of the pattern of the oxide semi-conductor layer form ohmic contact layers, and a region of the pattern of the oxide semi-conductor layer that is not illuminated, i.e., a region of the pattern of the oxide semi-conductor layer that is shielded by the light shielding layer forms a semi-conductor active layer. The base substrate is made of a light-transmissive material.

References are made to FIG. 6A to FIG. 6G, which illustrate schematic views of a method for manufacturing an oxide thin-film transistor of a top-gate structure according to some embodiments of the present disclosure, and the method includes following steps S31 to S36.

In step S31, a light shielding layer 106 is formed on a base substrate 101. The light shielding layer 106 may be made of a metallic material such as Mo, Al, or the like; or may be alternatively made of an organic material. A thickness of the light shielding layer 106 ranges from 200 nm to 300 nm.

In step S32, an inorganic insulating medium layer 107 is formed covering the light shielding layer 106. The inorganic insulating medium layer 107 is provided to protect an oxide semi-conductor layer from being affected by the light shielding layer 106 such that performance of the thin-film transistor is ensured. Optionally, the inorganic insulating medium layer 107 may be made of silicon dioxide, and a thickness of the inorganic insulating medium layer 107 ranges from 200 nm to 400 nm. The thickness of the inorganic insulating medium layer 107 is greater than the thickness of the light shielding layer 106 such that the light shielding layer 106 is completely covered by the inorganic insulating medium layer 107.

In step S33, a pattern of an oxide semi-conductor layer 104 is formed; and an orthographic projection of the pattern of the light shielding layer 106 onto the base substrate 101 is completely included within and is smaller than an orthographic projection of the pattern of the oxide semi-conductor layer 104 onto the base substrate 101.

A thickness of the oxide semi-conductor layer 104 ranges from 40 mm to 70 nm, the oxide semi-conductor layer 104 may be a single-layer structure; or may be a structure having more than one layer, where in the more than one layer, oxygen content of each layer differs from that of another layer.

In step S34, two opposite boundary regions of the pattern of the oxide semi-conductor layer 104 that are not shielded by the light shielding layer 106 are illuminated by a light source 202 provided at a side of the base substrate 101 away from the light shielding layer 106. The illuminated two opposite boundary regions of the pattern of the oxide semi-conductor layer 104 form ohmic contact layers 1041, and a region of the pattern of the oxide semi-conductor layer 104 that is not illuminated, i.e., a region of the pattern of the oxide semi-conductor layer 104 that is shielded by the light shielding layer 106, forms a semi-conductor active layer 1042.

The light shielding layer 106 can not only functions as a light shielding component during a process for forming the ohmic contact layers 1041, but also can protect the semi-conductor active layer 1042 from being illuminated by a backlight or other ambient nature lights, thus improving stability of the thin-film transistor.

In step S35, patterns of a gate insulator 103 and a gate electrode 102 are formed through one patterning process. The gate insulator 103 may be a single-layer structure such as a single layer of $SiO_2$, a double-layer structure such as one layer of $SiO_2$ and one layer of $SiN_x$, or a three-layer structure such as one layer of $SiO_2$, one layer of SiON and one layer of $SiN_x$. Optionally, a layer of the gate insulator 103 that is in contact with the semi-conductor active layer 1042 is a layer of $SiO_2$, such that hydrogen content of the semi-conductor active layer 1042 is minimized. A thickness of the gate insulator 103 ranges from 200 nm to 300 nm. Optionally, an area of the gate insulator 103 corresponds to an area of the semi-conductor active layer 1042.

The gate electrode 102 may be made of a metallic material such as Mo, Al, Cu or the like, a thickness of which ranges from 200 nm to 300 nm.

In other embodiments of the present disclosure, the gate insulator 103 may be a whole-layer structure having an area identical to that of the base substrate.

In step S36, an insulating interlayer 108 is formed, and via holes 1081 penetrating the insulating interlayer 108 are formed. Locations of the via holes 1081 correspond to locations of the ohmic contact layers 1041.

The insulating interlayer 108 may be a single layer of $SiN_x$, a thickness of which ranges from 200 mm to 400 nm.

In step S37, a source electrode 1051 and a drain electrode 1052 are formed, the source electrode 1051 and the drain electrode 1052 are connected to the ohmic contact layers 1041 through the via holes 1081, and are further connected to the semi-conductor active layer 1042 through the ohmic contact layers 1041.

Specifically, the source electrode 1051 and the drain electrode 1052 may be made of a metallic material such as Mo, Al, Cu or the like, a thickness of each ranges from 200 nm to 300 nm.

In each embodiment described above, the oxide semi-conductor layer may be made of oxide semi-conductor materials such as IGZO or ITZO.

The light source for illuminating the oxide semi-conductor layer may be an ultraviolet light source, or other types of light source such as an X ray. Optionally, a wavelength of lights emitted by the ultraviolet light source ranges from 173 nm to 365 nm and an illumination duration ranges from 1 to 30 seconds, in a case that the ultraviolet light source is used to illuminate the oxide semi-conductor layer.

Figure 7:
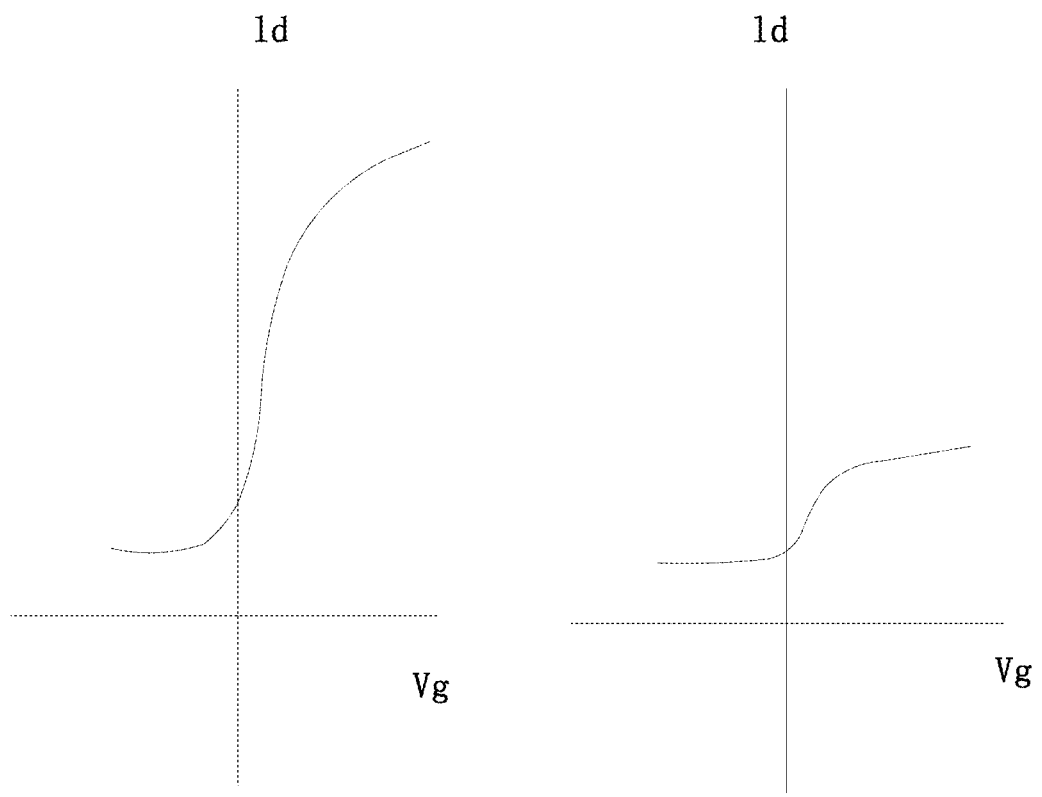
FIG. 7 shows a comparison between an I-V curve of an oxide thin-film transistor manufacturing in light illumination manner according to some embodiments of the present disclosure and an I-V curve of an oxide thin-film transistor formed using a plasma treatment process on which a reversible change is experienced.

References are made to FIG. 7. A left part of FIG. 7 illustrates an I-V curve of an oxide thin-film transistor formed in a light illumination manner according to some embodiments of the present disclosure, and a right part of FIG. 7 illustrates an I-V curve of an oxide thin-film transistor formed using a plasma treatment process, on which a reversible change is experienced. As can be seen from FIG. 7, if a reversible change occurs to ohmic contact layers formed using the plasma treatment process, i.e., the conductive ohmic contact layers are changed back to semi-conductors, and resistivity of the ohmic contact layers is greater than 1 KΩ per square, an on-state current may be decreased, and the oxide thin-film transistor may be out of the switching function if resistance of the oxide thin-film transistor increases to a certain degree.

It is further provided a method for manufacturing an oxide thin-film transistor array substrate in the present disclosure, including steps for manufacturing the oxide thin-film transistor which may be implemented using any method employed in the above embodiments and is not described herein repeatedly.

According to embodiments of the present disclosure, the method for manufacturing an oxide thin-film transistor array substrate may include following steps S41 to S49.

In step S41, a light shielding layer is formed on a base substrate. In step S42, an inorganic insulating medium layer is formed. In step S43, ohmic contact layers are formed. In step S44, a semi-conductor active layer is formed. In step S45, a gate insulator and a gate electrode are formed. In step S46, an insulating interlayer is formed.

In step S47, a source electrode and a drain electrode are formed. The above steps may be understood with reference to the method shown in FIG. 6A to FIG. 6G, which is not described repeatedly.

In step S48, a passivation layer is formed.

In step S49, a pixel electrode is formed.

The pixel electrode may be made of a transparent conductive material such as ITO, IZO or the like, a thickness of which ranges from 40 nm to 70 nm.

In a case that the array substrate includes a common electrode, the method further includes: forming a second passivation layer on the pixel electrode, and forming a common electrode on the second passivation layer.

Specifically, the second passivation layer may be a single-layer structure, such as a single layer of $SiO_2$, or a double-layer structure such as one layer of $SiO_2$ and one layer of $SiN_x$. A thickness of the second passivation layer ranges from 200 nm to 300 nm. The common electrode may be made of a transparent conductive material such as ITO, IZO or the like, a thickness of which ranges from 40 nm to 70 nm.

In order to improve stability of the oxide thin-film transistor, and reduce resistivities of the pixel electrode and the common electrode, a final annealing process needs to be performed after the oxide thin-film transistor is manufactured, where an annealing temperature generally ranges from 200 to 300 Celsius degrees.

It is further provided an oxide thin-film transistor in the present disclosure, which includes: ohmic contact layers, a semi-conductor active layer, a source electrode and a drain electrode, the source electrode and the drain electrode are connected to the semi-conductor active layer through the ohmic contact layers. The ohmic contact layers and the semi-conductor active layer are formed by illuminating, by a light source, a pattern of an oxide semi-conductor layer that is partially sheltered by a light shielding layer. Illuminated two opposite boundary regions of the pattern of the oxide semi-conductor layer form the ohmic contact layers, and a region of the pattern of the oxide semi-conductor layer that is not illuminated, i.e., a region of the pattern of the oxide semi-conductor layer that is shielded by the light shielding plate, forms the semi-conductor active layer.

It is further provided an oxide thin-film transistor array substrate in the present disclosure, which includes the oxide thin-film transistor described in above embodiments.

It is further provided a display device in the present disclosure, which includes the oxide thin-film transistor array substrate described above.

Those described above are preferred embodiments of the present disclosure. It should be noted that, for the skilled in the art, improvements and modifications may also be made without departing from the principle of the invention. Those improvements and modifications should also be included in the scope of protection of the present disclosure.

What is claimed is:

1. A method for manufacturing an oxide thin-film transistor, comprising:
    forming a pattern of a light shielding layer on a base substrate that is made of a light-transmissive material, wherein the light shielding layer is made of an organic material;
    forming a pattern of an oxide semi-conductor layer above the base substrate, wherein an orthographic projection of the pattern of the light shielding layer onto the base substrate is completely located within and is smaller than an orthographic projection of the pattern of the oxide semi-conductor layer onto the base substrate;
    providing the ultraviolet light source at a side of the base substrate away from the light shielding layer;
    illuminating, by the ultraviolet light source, two opposite boundary regions of the pattern of the oxide semi-conductor layer that are not shielded by the light shielding layer, wherein the illuminated two opposite boundary regions of the pattern of the oxide semi-conductor layer form ohmic contact layers and a region of the pattern of the oxide semi-conductor layer that is not illuminated forms a semi-conductor active layer;
    forming a gate insulator on the semi-conductor active layer and forming a gate electrode on the gate insulator; and
    forming a source electrode and a drain electrode, wherein the source electrode and the drain electrode are connected to the semi-conductor active layer via the ohmic contact layers respectively,
    wherein the oxide thin-film transistor is of a top-gate structure, and the gate electrode is arranged between the semi-conductor active layer and the source electrode and the drain electrode in a direction in which the semi-conductor active layer, the gate insulator, and the gate electrode are stacked, and the light shielding layer is sandwiched between the oxide semi-conductor layer and the base substrate.

2. The method according to claim 1, wherein after the step of forming the pattern of the light shielding layer on the base substrate and before the step of forming the pattern of the oxide semi-conductor layer above the base substrate, the method further comprises:
    forming an inorganic insulating medium layer covering the light shielding layer.

3. The method according to claim 2, wherein the inorganic insulating medium layer is made of silicon dioxide.

4. The method according to claim 1, wherein
    subsequent to forming the gate insulator on the semi-conductor active layer and forming the gate electrode on the gate insulator, the method further comprises:
    forming an insulating interlayer and forming via holes penetrating the insulating interlayer, wherein locations of the via holes correspond to locations of the ohmic contact layers;
    wherein the source electrode and the drain electrode cover the via holes respectively, and are connected with the ohmic contact layers through the via holes.

5. The method according to claim 4, wherein the insulating interlayer is a single layer of $S_iN_x$.

6. The method according to claim 1, wherein a wavelength of the ultraviolet light source ranges from 173 nm to 365 nm, and an illumination duration of the ultraviolet light source ranges from 1 to 30 seconds.

7. The method according to claim 1, wherein the oxide semi-conductor layer is made of indium gallium zinc oxide or indium tin zinc oxide.

8. The method according to claim 1, wherein the gate insulator and the gate electrode are formed through a single patterning process.

9. The method according to claim 1, wherein the oxide semi-conductor layer is a structure having a plurality of layers, and oxygen content of each of the layers differs from that of the other of the layers.

10. The method according to claim 1, wherein the gate insulator is a structure having a plurality of layers, and the layer of the gate insulator that is in contact with the pattern of the oxide semi-conductor is a layer of $S_iO_2$.

11. The method according to claim 10, wherein the gate insulator is a double-layer structure with one layer of $S_iO_2$ and one layer of $S_iN_x$.

12. The method according to claim 10, wherein the gate insulator is a three-layer structure with one layer of $S_iO_2$, one layer of $S_iON$, and one layer of $S_iN_x$.

13. A method for manufacturing an oxide thin-film transistor array substrate, comprising:

forming a pattern of a light shielding layer on a base substrate that is made of a light-transmissive material, wherein the light shielding layer is made of an organic material;

forming a pattern of an oxide semi-conductor layer above the base substrate, wherein an orthographic projection of the pattern of the light shielding layer onto the base substrate is completely located within and is smaller than an orthographic projection of the pattern of the oxide semi-conductor layer onto the base substrate;

providing the ultraviolet light source at a side of the base substrate away from the light shielding layer;

illuminating, by an ultraviolet light source, two opposite boundary regions of the pattern of the oxide semi-conductor layer that are not shielded by the light shielding layer, wherein the illuminated two opposite boundary regions of the pattern of the oxide semi-conductor layer form ohmic contact layers and a region of the pattern of the oxide semi-conductor layer that is not illuminated forms a semi-conductor active layer;

forming a gate insulator on the semi-conductor active layer and forming a gate electrode on the gate insulator; and forming a source electrode and a drain electrode, wherein the source electrode and the drain electrode are connected to the semi-conductor active layer via the ohmic contact layers respectively, wherein the oxide thin-film transistor is of a top-gate structure, and the gate electrode is arranged between the semi-conductor active layer and the source electrode the drain electrode in a direction in which the semi-conductor active layer, the gate insulator, and the gate electrode are stacked, and the light shielding layer is sandwiched between the oxide semi-conductor layer and the base substrate.

14. The method according to claim 13, further comprising:

forming a passivation layer; and forming a pixel electrode and a common electrode.

15. The method according to claim 13, wherein after the step of forming the pattern of the light shielding layer on the base substrate and before the step of forming the pattern of the oxide semi-conductor layer above the base substrate, the method further comprises:

forming an inorganic insulating medium layer covering the light shielding layer.

16. The method according to claim 13, wherein subsequent to forming the gate insulator on the semi-conductor active layer and forming the gate electrode on the gate insulator, the method further comprises:

forming an insulating interlayer and forming via holes penetrating the insulating interlayer, wherein locations of the via holes correspond to locations of the ohmic contact layers;

wherein the source electrode and the drain electrode cover the via holes respectively, and are connected with the ohmic contact layers through the via holes.

17. An oxide thin-film transistor, comprising:

a base substrate, a light shielding layer, ohmic contact layers, a semi-conductor active layer, a gate insulator, a gate electrode, a source electrode and a drain electrode, wherein the source electrode and the drain electrode are connected to the semi-conductor active layer through the ohmic contact layers, wherein the ohmic contact layers and the semi-conductor active layer are formed by illuminating a pattern of an oxide semi-conductor layer by an ultraviolet light source, wherein the illuminated two opposite boundary regions of the pattern of the oxide semi-conductor layer form ohmic contact layers and a region of the pattern of the oxide semi-conductor layer that is not illuminated forms a semi-conductor active layer, wherein the oxide thin-film transistor is of a top-gate structure, and the gate electrode is arranged between the semi-conductor active layer and the source electrode and the drain electrode in a direction in which the semi-conductor active layer, the gate insulator, and the gate electrode are stacked, and the light shielding layer is sandwiched between the oxide semi-conductor layer and the base substrate, wherein the ohmic contact layers and the semi-conductor active layer are formed by steps of:

forming a pattern of a light shielding layer on a base substrate, wherein an orthographic projection of the pattern of the light shielding layer onto the base substrate is completely located within and is smaller than an orthographic projection of the pattern of the oxide semi-conductor layer onto the base substrate;

providing the ultraviolet light source at a side of the base substrate away from the light shielding layer; and illuminating, by the ultraviolet light source, the two opposite boundary regions of the pattern of the oxide semi-conductor layer that are not shielded by the light shielding layer, and wherein the base substrate is made of a light-transmissive material and the light shielding layer is made of an organic material.

18. An oxide thin-film transistor array substrate, comprising the oxide thin-film transistor according to claim 17.

19. A display device, comprising the oxide thin-film transistor array substrate according to claim 18.

* * * * *